United States Patent [19]
Rahim et al.

[11] Patent Number: 5,405,790
[45] Date of Patent: Apr. 11, 1995

[54] METHOD OF FORMING A SEMICONDUCTOR STRUCTURE HAVING MOS, BIPOLAR, AND VARACTOR DEVICES

[75] Inventors: Irfan Rahim, Chandler; Bor-Yuan C. Hwang, Tempe; Julio Costa, Phoenix, all of Ariz.

[73] Assignee: Motorola, Inc., Schaumburg, Ill.

[21] Appl. No.: 155,882

[22] Filed: Nov. 23, 1993

[51] Int. Cl.⁶ .......................................... H01L 21/265
[52] U.S. Cl. ........................................ 437/34; 437/60; 437/200; 148/DIG. 9
[58] Field of Search ................. 437/34, 60, 31, 32, 437/59, 47, 919, 200; 148/DIG. 9, DIG. 14

[56] References Cited

U.S. PATENT DOCUMENTS

| | | | |
|---|---|---|---|
| 3,865,649 | 2/1975 | Beasom | 437/919 |
| 4,377,029 | 3/1983 | Ozawa | 437/919 |
| 4,734,382 | 3/1988 | Krishna | 437/47 |
| 4,827,319 | 5/1989 | Pavlidis et al. | 357/14 |
| 4,898,839 | 2/1990 | Fujinuma et al. | 437/919 |
| 4,939,099 | 7/1990 | Seacrist et al. | 437/60 |
| 5,013,677 | 5/1991 | Hozumi | 437/47 |
| 5,038,184 | 8/1991 | Chiang et al. | 357/14 |
| 5,134,082 | 7/1992 | Kirchgessner | 437/31 |
| 5,173,835 | 12/1992 | Cornett et al. | 437/180 |
| 5,181,091 | 1/1993 | Harrington, III et al. | 257/355 |

*Primary Examiner*—Brian E. Hearn
*Assistant Examiner*—Tuan Nguyen
*Attorney, Agent, or Firm*—Rennie W. Dover

[57] ABSTRACT

A varactor (10, 115, 122) is formed using a BICMOS process flow. An N well (28) of a varactor region (13) is formed in an epitaxial layer (22) by doping the epitaxial layer (22) with an N type dopant. A cathode region (55, 132) is formed in the N well (28) by further doping the N well (28) with the N type dopant. Cathode electrodes (91, 114) are formed by patterning a layer of polysilicon (62, 86) over the epitaxial layer (22). Subsequently, the cathode electrodes (91, 114) are doped with an N type dopant. A region adjacent the cathode region (55, 132) is doped to form a lightly doped region (103, 117). The lightly doped region (103, 117) is doped with a P type dopant to form an anode region (109, 119).

5 Claims, 12 Drawing Sheets

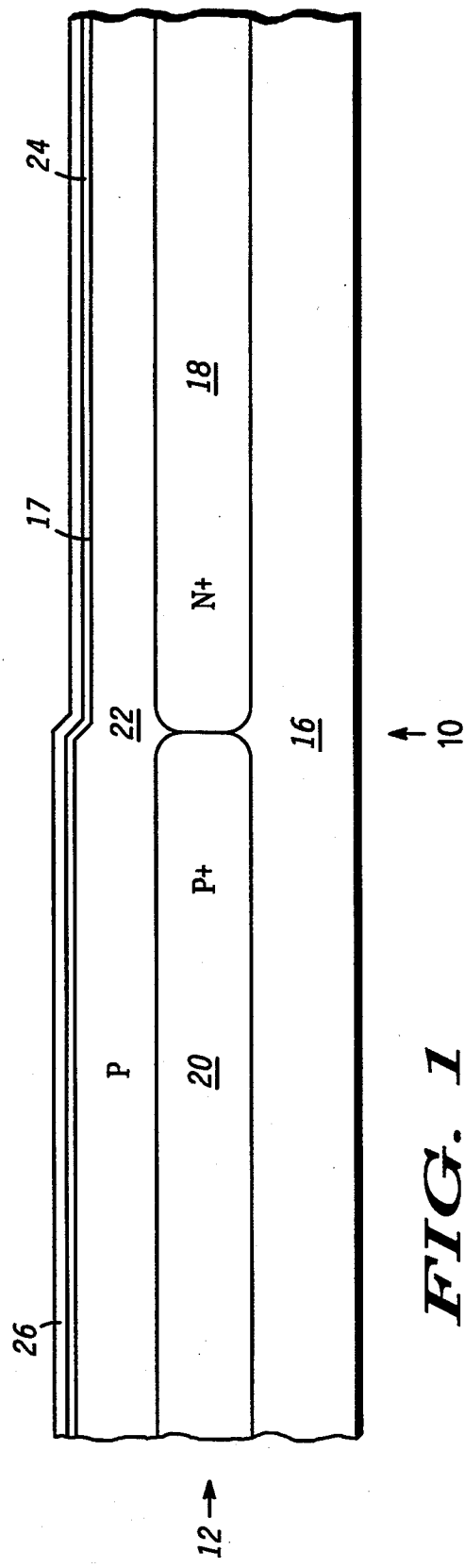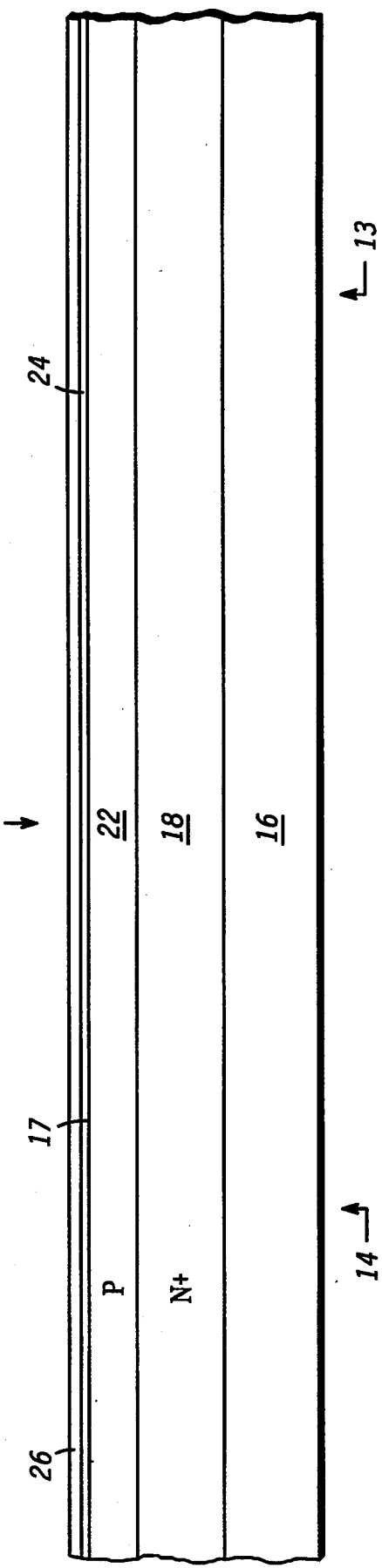

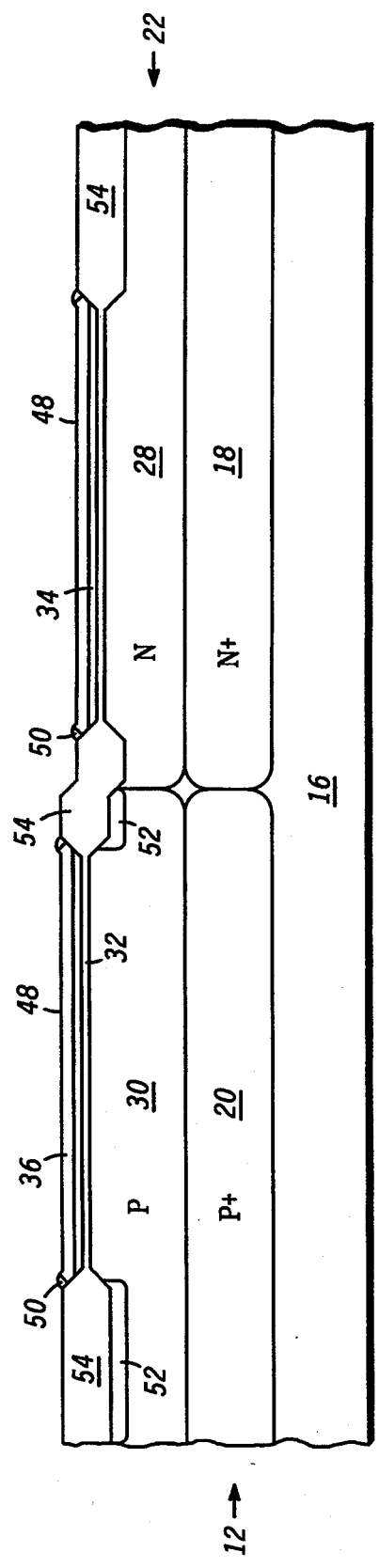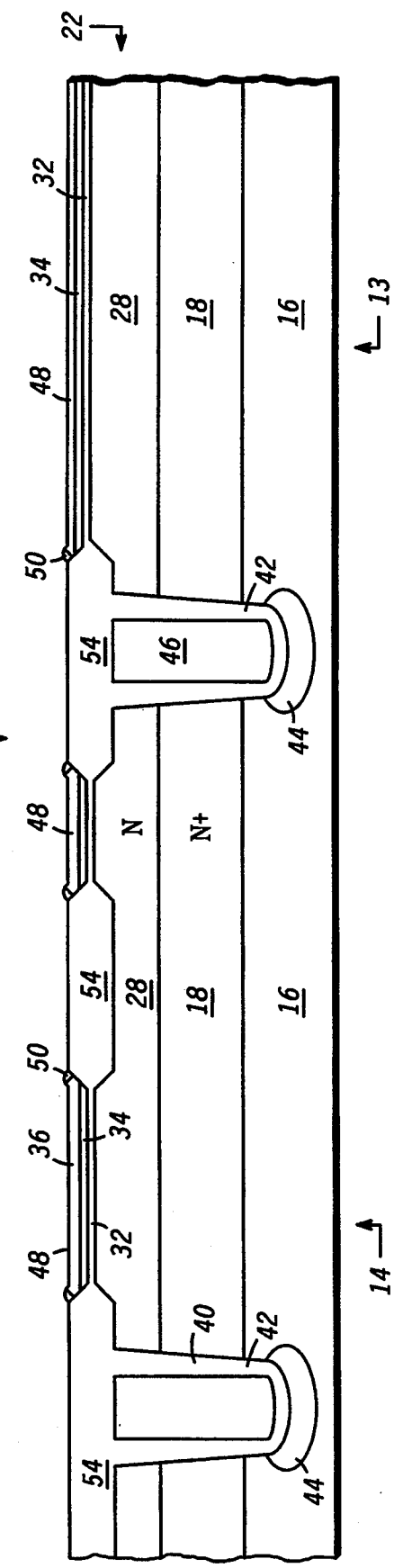

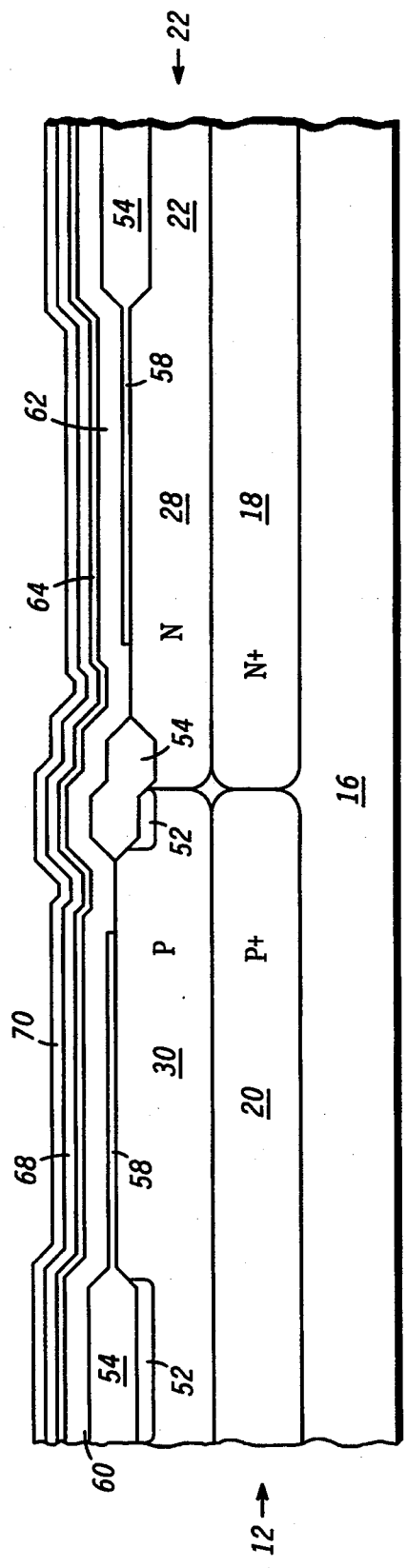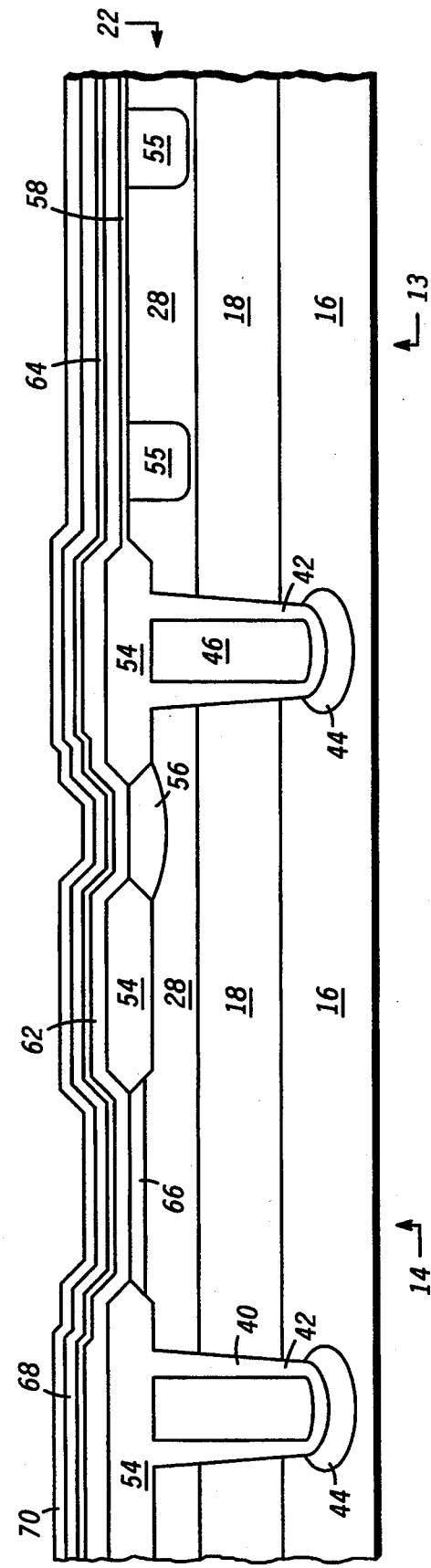
FIG. 11
FIG. 12

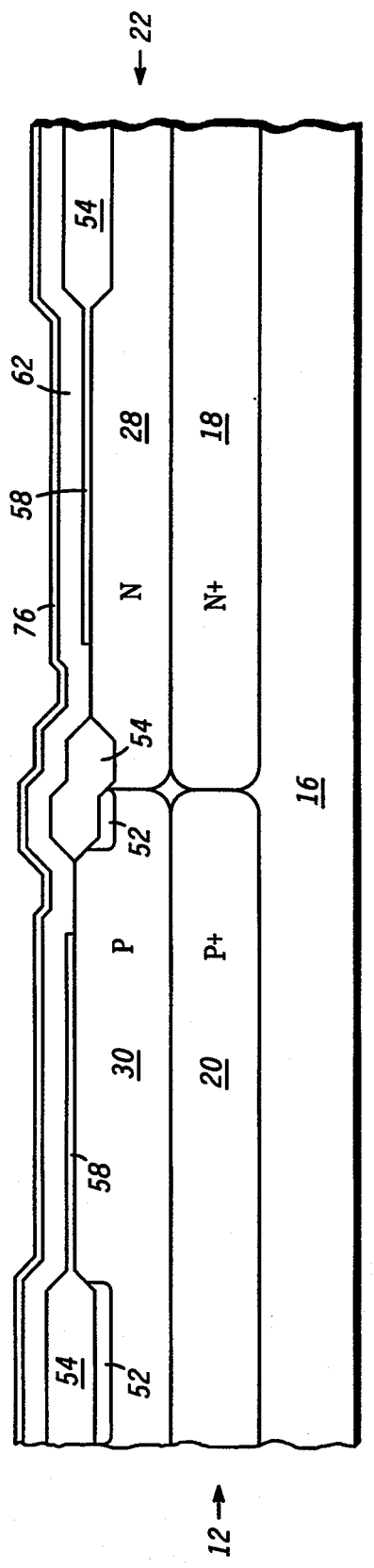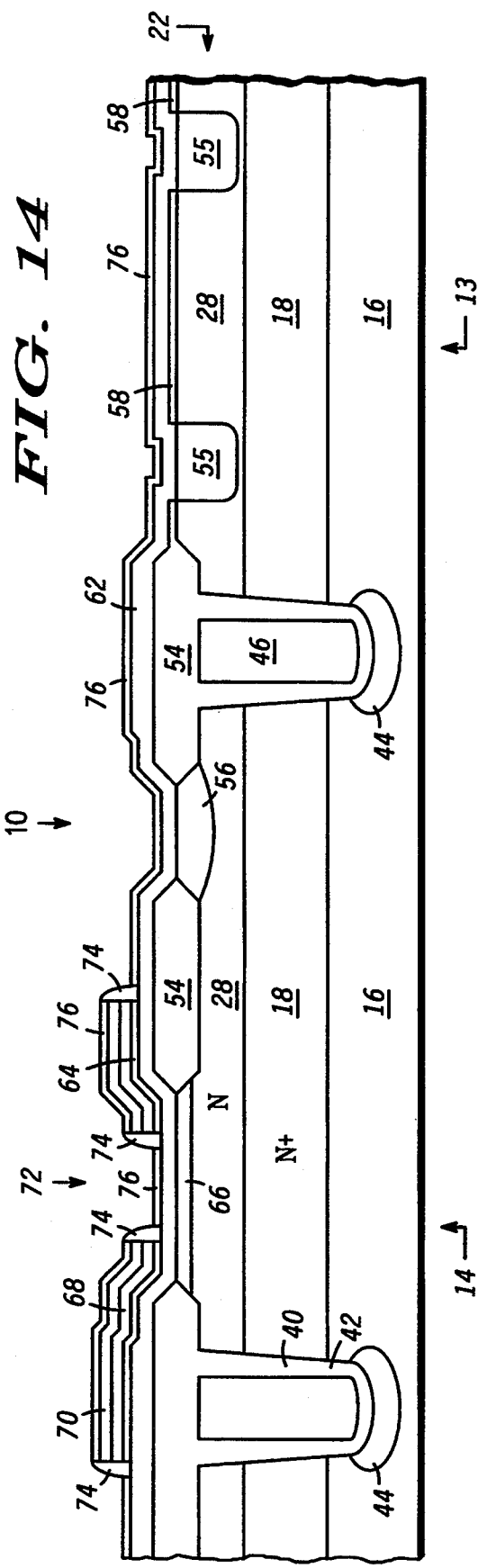

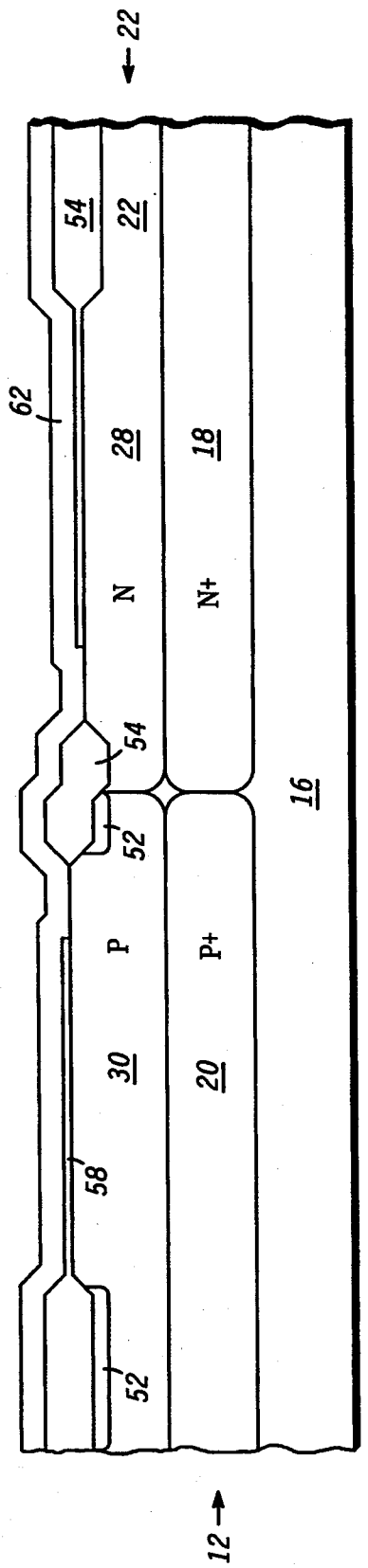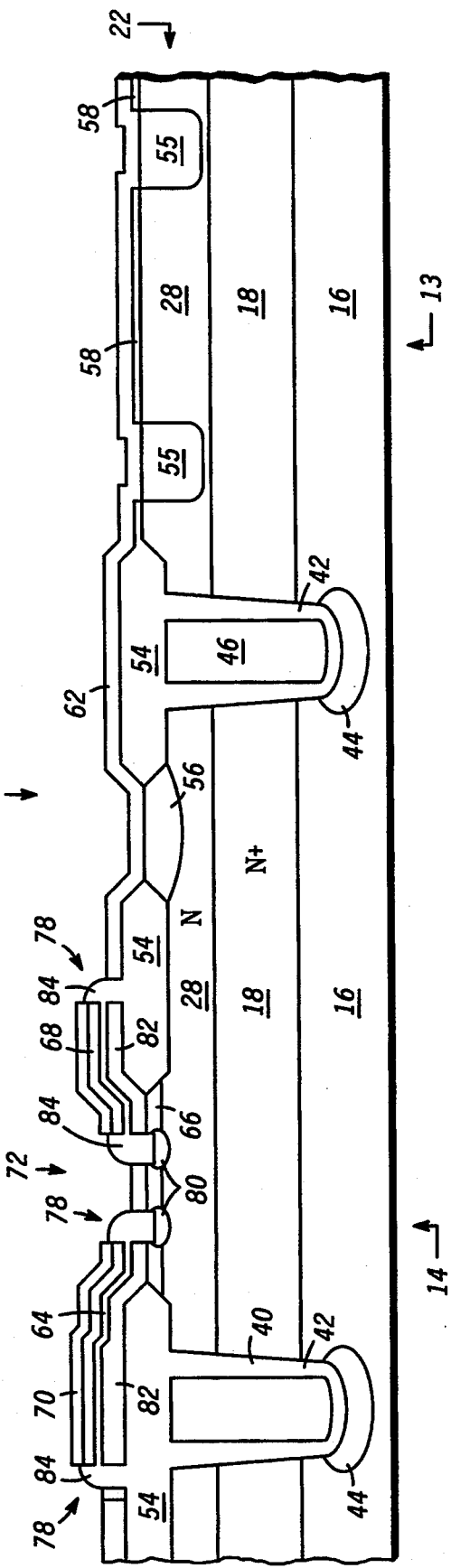
FIG. 15
FIG. 16

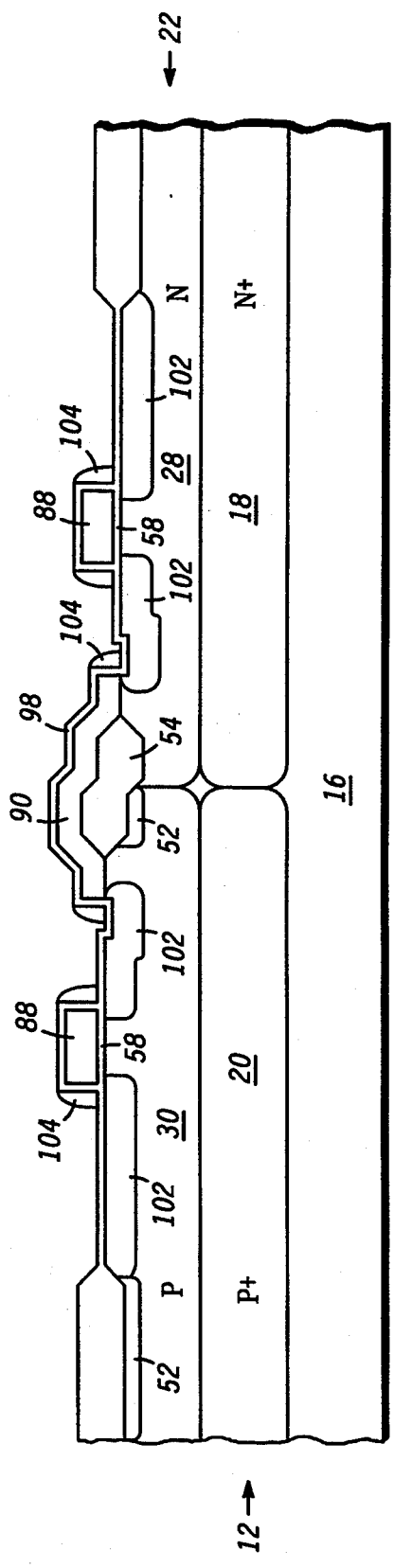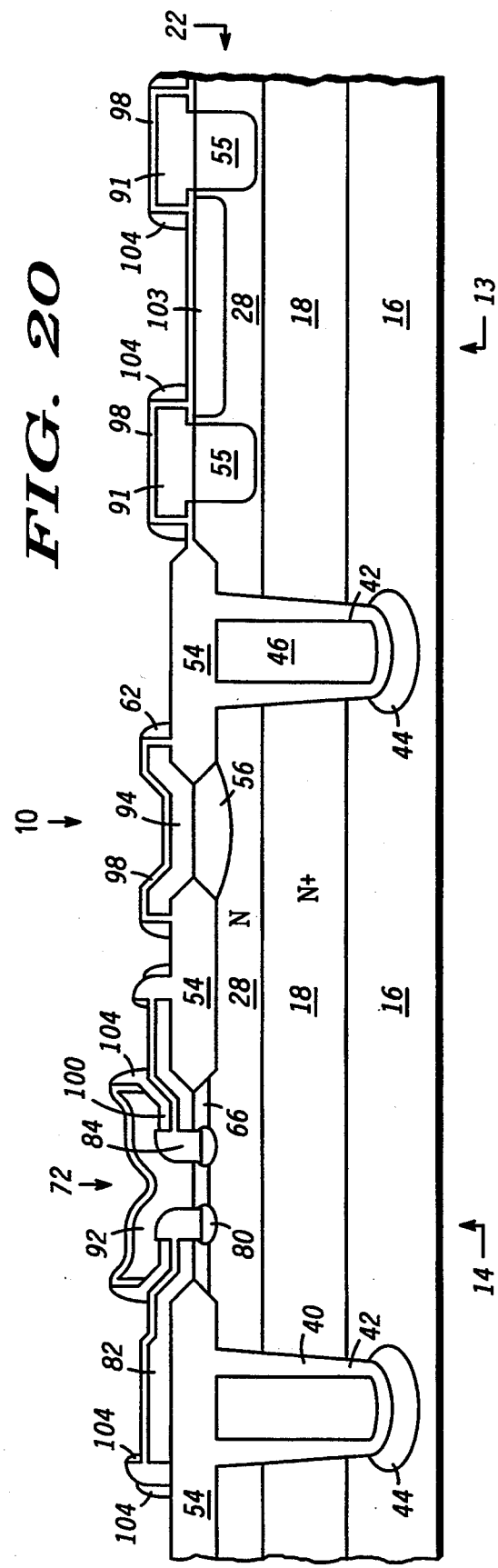
FIG. 19
FIG. 20

METHOD OF FORMING A SEMICONDUCTOR STRUCTURE HAVING MOS, BIPOLAR, AND VARACTOR DEVICES

FIELD OF THE INVENTION

This invention relates, in general, to varactors and more particularly to integrated varactors and methods of fabricating integrated varactors.

BACKGROUND OF THE INVENTION

Semiconductor capacitors are used in a variety of applications including operational amplifier frequency compensation, conversion of analog signals to digital signals, modulation of logic output voltage rise and fall times, etc. Fabrication of semiconductor capacitors using monolithic integrated circuit fabrication techniques is well known in the semiconductor art. A particularly useful type of semiconductor capacitor is the voltage variable capacitor, more commonly referred to as a varactor. Varactors are used in a variety of applications such as the electronic tuning of oscillators and the mixing or the generation of harmonics of electrical signals. Due to the difficulty in fabricating varactors having a low series resistance, a desirable change in capacitance for a given change in voltage, and a low DC leakage current using high performance integrated circuit processes, these devices are typically manufactured as discrete components having an electrical contact on each side of a semiconductor substrate.

Accordingly, it would be advantageous to have a method of manufacturing a varactor that is readily incorporated into a high performance integrated circuit process and that provides a low series resistance and a desirable change in capacitance for a given change in voltage.

BRIEF DESCRIPTION OF THE DRAWINGS

FIGS. 1–10 are highly enlarged cross-sectional views of an isolation module portion for a varactor-BICMOS semiconductor structure during processing in accordance with an embodiment of the present invention;

FIGS. 11–20 are highly enlarged cross-sectional views of a varactor-BICMOS semiconductor structure during processing in accordance with a first embodiment of the present invention;

DETAILED DESCRIPTION OF THE DRAWINGS

Figure 3:
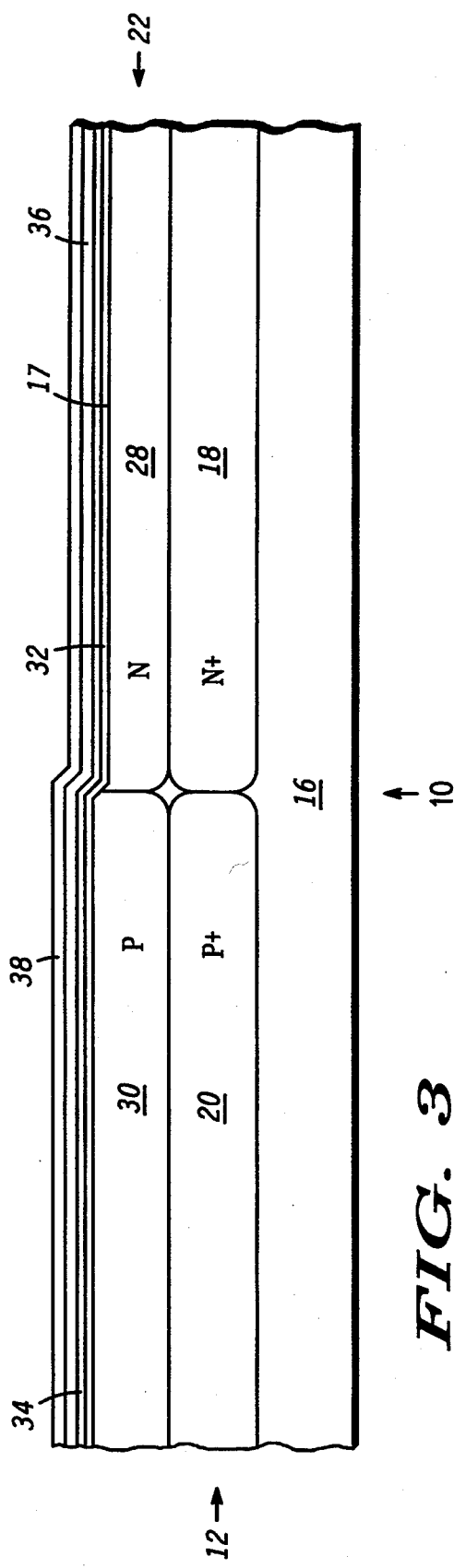

FIGS. 1–10 are highly enlarged cross-sectional views of an isolation module portion of a varactor-BICMOS semiconductor structure 10 during processing wherein FIGS. 1, 3, 5, 7, and 9 represent a MOS region 12 of the semiconductor structure 10 and FIGS. 2, 4, 6, 8, and 10 represent varactor and bipolar regions, 13 and 14, respectively, of the semiconductor structure 10. The portions shown in FIGS. 1–10 represent an isolation module for the semiconductor structure 10. Although specific materials, conductivity types, thicknesses and other parameters are set forth herein, it should be understood that these are not meant to be limiting and only serve to show a preferred embodiment of the present invention. Further, it should be understood that the same reference numerals are used in the figures to denote the same elements.

Initially, a semiconductor substrate 16 comprising single crystal silicon of a <100> crystallographic orientation is provided. The substrate 16 is of a P conductivity type and has a resistivity on the order of 6 to 8 ohm-centimeters. A screen oxide layer (not shown) is formed on the substrate 16. The screen oxide layer (not shown) is thermally grown and has a thickness on the order of 200 angstroms. The screen oxide layer serves to protect the surface of the substrate 16 from contamination.

An N+ buried layer 18 is formed in the substrate 16 by implanting arsenic or another N type dopant into the substrate 16. The N type dopant is implanted throughout the entire varactor and bipolar regions 13 and 14, respectively, and in the portion of the MOS region 12 where a P channel MOS transistor is to be fabricated. Once the N+ buried layer has been formed, it is annealed to obtain the desired dopant profile. As disclosed herein, the N+ buried layer 18 has a surface dopant concentration on the order of $10^{19}$ atoms per cubic centimeter (atoms/cm$^3$).

Simultaneously with the anneal of the N+ buried layer 18, additional oxide is grown on the screen oxide layer (not shown). The thickness of the screen oxide layer becomes on the order of 3000 to 4000 angstroms over the N+ buried layer 18. The screen oxide layer grows faster over the portions of the substrate 16 having the N+ buried layer 18 than over the portions of the substrate 16 where the N+ buried layer 18 is absent. More particularly, the screen oxide layer grows faster over the portion of the MOS region 12 where the P channel MOS transistor is to be fabricated than over the MOS region 12 where the N channel MOS transistor is to be fabricated. Therefore, the portion of the screen oxide layer disposed over the MOS region 12 not including the N+ buried layer 18 will have a thickness on the order of 500 to 600 angstroms.

A P+ buried layer 20 is formed in the portion of the MOS region 12 where the N+ buried layer 18 was not formed. The P+ buried layer 20 is formed in the portion of MOS region 12 where an N-channel MOS transistor is to be formed. The P+ buried layer 20 is formed by implanting boron or another P type dopant into the substrate 16. After forming the P+ buried layer 20, it is annealed. As shown herein, the P+ buried layer 20 has a surface dopant concentration on the order of $10^{17}$ to $10^{18}$ atoms/cm$^3$.

Following the formation of the buried layers 18 and 20, the entire screen oxide layer is removed to expose the substrate 16, wherein the substrate 16 includes the buried layers 18 and 20. The screen oxide layer may be removed with a wet etchant such as, for example, hydrofluoric acid. Once the screen oxide layer has been completely removed and the substrate 16 exposed, a semiconductor material such as an epitaxial layer 22 having a major surface 17 is formed on the substrate 16. The epitaxial layer 22 is formed by methods well known in the art. The epitaxial layer 22 is lightly doped with a P type impurity material having a dopant concentration on the order of $10^{15}$ to $10^{16}$ atoms/cm$^3$ and may be in situ doped. The thickness of the epitaxial layer 22 is on the order of 1.6 micrometers.

A well oxide layer 24 is formed on the epitaxial layer 22. The well oxide layer 24 has a thickness on the order of 500 angstroms and may be thermally grown or deposited. A well nitride layer 26 is then deposited on the well oxide layer 24. The well nitride layer 26 has a thickness on the order of 1400 angstroms. As shown, the epitaxial layer 22, the well oxide layer 24, and the well nitride layer 26 are conformally formed over the entire surface of the MOS region 12, the varactor region 13, and the bipolar region 14.

Figure 4:
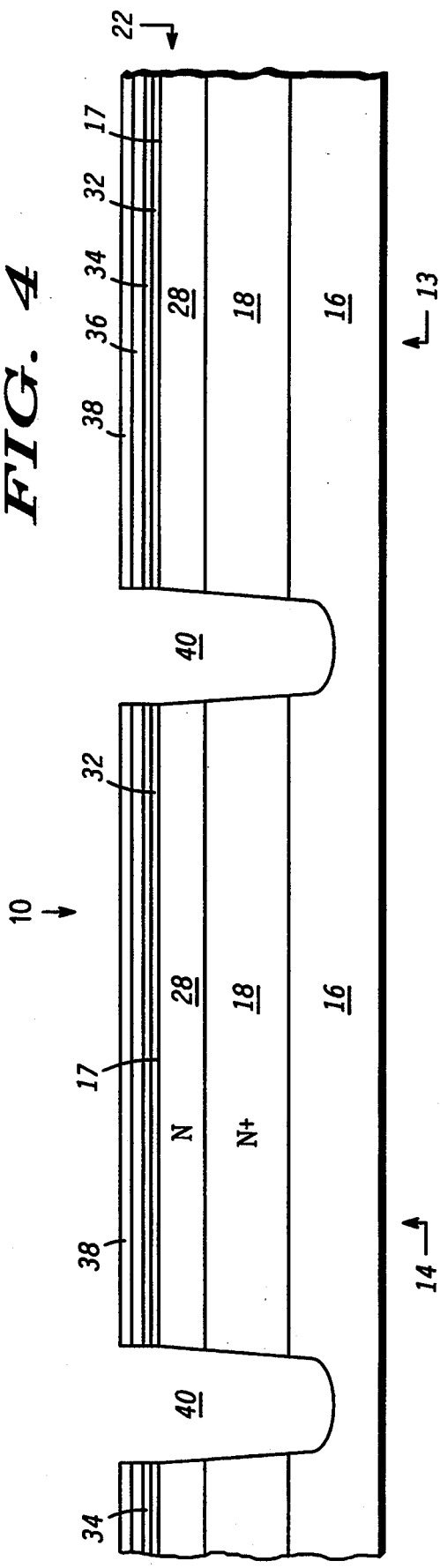

Now referring specifically to FIGS. 3 and 4, the portion of the well nitride layer 26 (see FIGS. 1 and 2) disposed over the N+ buried layer 18 is removed, preferably by reactive ion etching (RIE). At this point, the well nitride layer 26 remains disposed over the P+ buried layer 20. Phosphorus or another N type dopant is implanted into the portion of the epitaxial layer 22 above the N+ buried layer 18 to form N wells 28. Subsequently, the N wells are annealed. Simultaneous with the anneal of the N wells 28, the portions of the well oxide layer 24 (see FIG. 1) disposed above the N wells 28 are further thermally oxidized to a thickness on the order of 3000–4000 angstroms.

Following the oxidation and anneal steps, the remaining portion of the well nitride layer 26 disposed over the P+ buried layer 20 is removed. An etch that will selectively remove the well nitride layer 26 without significantly etching the well oxide layer 24 disposed therebeneath is employed. Once this portion of the well nitride layer 26 has been removed, boron or another P type dopant is implanted into the epitaxial layer 22 above the P+ buried layer 20 to form the P well 30 over the P+ buried layer 20. The increased thickness of the well oxide layer 24 over the N wells 28 is sufficient to prohibit the P type dopant from significantly entering the N wells 28. After implanting the P type dopant, the P well 30 is annealed. Following the anneal of the P well 30, the well oxide layer 24 is completely removed from the surface of the epitaxial layer 22 in which the N wells 28 and the P well 30 have been formed.

Following the removal of the well oxide layer 24, a pad oxide layer 32 is formed on the surface of the epitaxial layer 22. The pad oxide layer 32 has a thickness on the order of 150 angstroms and may be formed by thermally oxidizing the epitaxial layer 22. A polysilicon layer 34 is formed on the pad oxide layer 32. The polysilicon layer 34 is deposited and has a thickness on the order of 500 angstroms. A nitride layer 36 is deposited on the polysilicon layer 34. The nitride layer 36 has a thickness on the order of 1500 angstroms. An oxide layer 38 is formed on the nitride layer 36. The oxide layer 38 has a thickness on the order of 2600 angstroms and may be formed by well known processes such as deposition by the decomposition of tetraethyl orthosilicate (TEOS).

Isolation trenches 40 are formed in varactor and bipolar regions 13 and 14, respectively, through the N+ buried layer 18. Preferably, the trenches 40 are formed by patterning a photoresist layer (not shown) to have openings above the regions where the trenches 40 are to be formed. The oxide layer 38 and the nitride layer 36 below the openings in the photoresist are etched using, for example, an RIE etch. Subsequently, an RIE etch is performed through the polysilicon layer 34, the pad oxide layer 32, the epitaxial silicon 22 and into the substrate 16 beneath the N+ buried layer 18.

Figure 5:
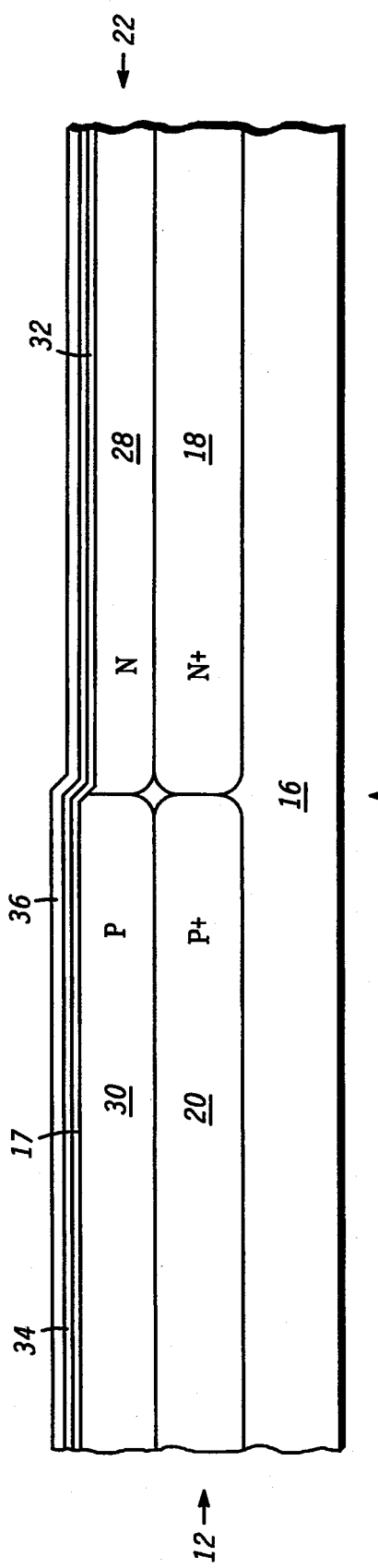
Figure 6:
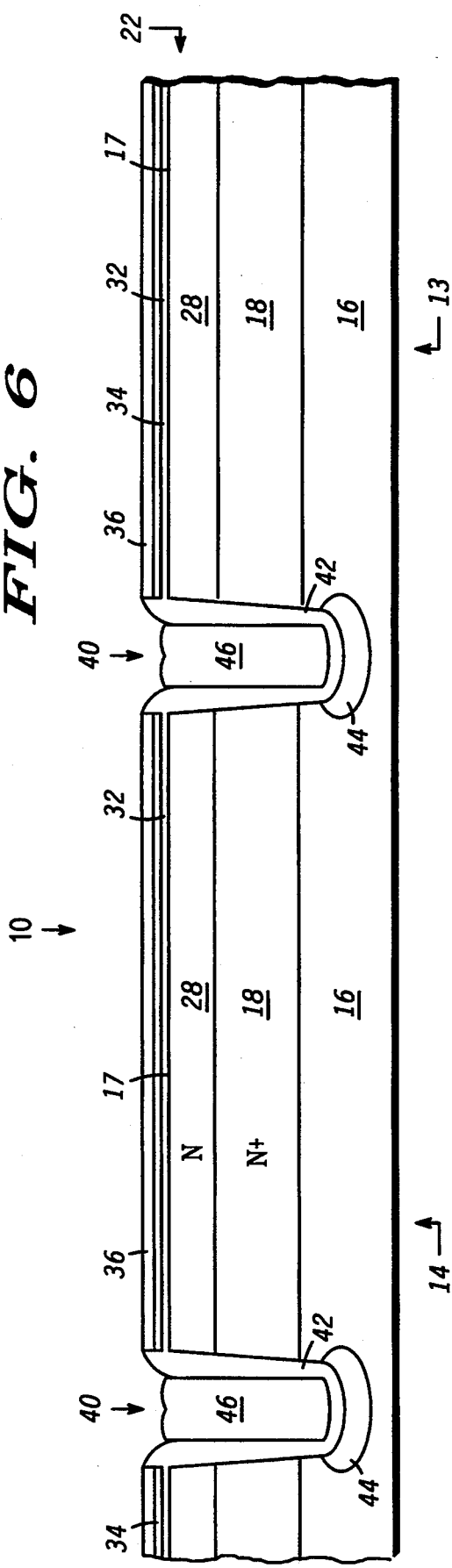

Now referring to FIGS. 5 and 6, the oxide layer 38 is removed and the surfaces of the trenches 40 are cleaned. A trench liner oxide 42 is formed in the trenches 40. Although the trench liner oxide 42 is only shown in the trenches 40, it should be understood that the trench liner oxide 42 is originally formed as a conformal layer. Initially, the trench liner oxide 42 has a thickness on the order of 400 angstroms. Once the trench liner oxide 42 has been formed, channel stops 44 are formed. As shown herein, the channel stops 44 are formed by implanting boron or another P type dopant into the substrate 16 below the trenches 40, i.e., a channel stop implant is performed. Following the channel stop implant, additional oxide is formed on the trench liner oxide 42 to give it a thickness on the order of 2600 angstroms. It should be understood that in addition to being formed in the trenches 40, this additional oxide is also formed conformally (not shown) on the surfaces of the MOS region 12, the varactor region 13, and the bipolar region 14.

A trench fill polysilicon 46 is formed in the trenches 40. Although not shown, it shall be understood that the trench fill polysilicon 46 is also formed conformally on the surface of the MOS region 12, the varactor region 13, and the bipolar region 14. A spin-on glass (not shown) is applied over the surface of the MOS region 12, the varactor region 13, and the bipolar region 14. The spin-on glass serves to planarize the surfaces. The spin-on glass and the portions of the trench fill polysilicon 46 not disposed in the trenches 40 are etched back by RIE until the conformal trench liner oxide 42 is exposed. The trench fill polysilicon 46 is etched back in the trenches 40 so that the trench fill polysilicon 46 is recessed from the top of the trenches 40. Once the trench fill polysilicon 46 has been etched back, the portions of the trench liner oxide 42 not disposed in the trenches 40 are removed, preferably by RIE.

Now referring specifically to FIGS. 7 and 8, the trench liner oxide 42 is removed from the surfaces of the MOS region 12, the varactor region 13, and the bipolar region 14 to expose the nitride layer 36. Portions of the nitride layer 36 are removed so that only the nitride portions 48 remain. Nitride spacers 50 are formed on the ends of the nitride portions 48 by depositing a conformal nitride layer (not shown) over the surfaces of the MOS region 12, the varactor region 13, and the bipolar region 14. The conformal nitride layer (not shown) is anisotropically etched using RIE to form the nitride spacers 50.

Following the formation of the nitride spacers 50, field regions 52 are formed by implanting a P type dopant into the P well 30 to control inversion beneath the field oxide regions 54. The implant into the field regions 52 is self-aligned to the nitride portions 48 and to the nitride spacers 50 disposed above the P well 30. More particularly, the field regions 52 are formed by implanting boron or another P type dopant into the P well 30. The field regions 52 have a dopant concentration on the order of $10^{17}$ atoms/cm$^3$. The exposed portions of the polysilicon layer 34 (those not disposed beneath the nitride portions 48) and the trench fill polysilicon 46 are oxidized to form the field oxide regions 54. The field oxide regions 54 have a thickness on the order 6000 to 7000 angstroms. It should be understood that the field regions 52 are annealed during the formation of the field oxide regions 54.

Figure 9:
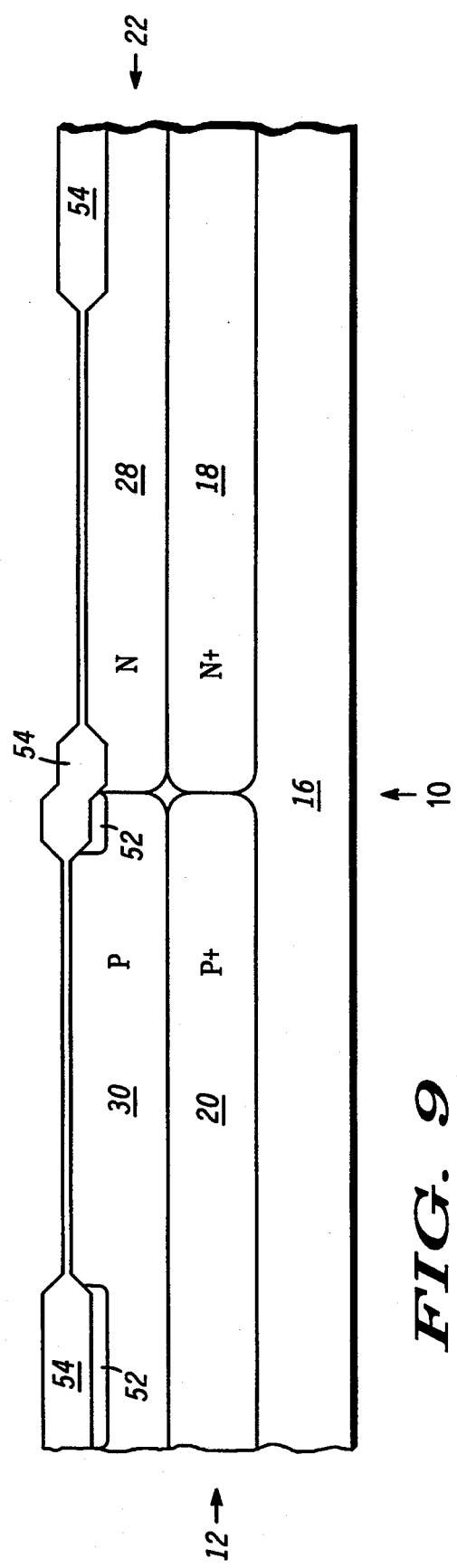
Figure 10:
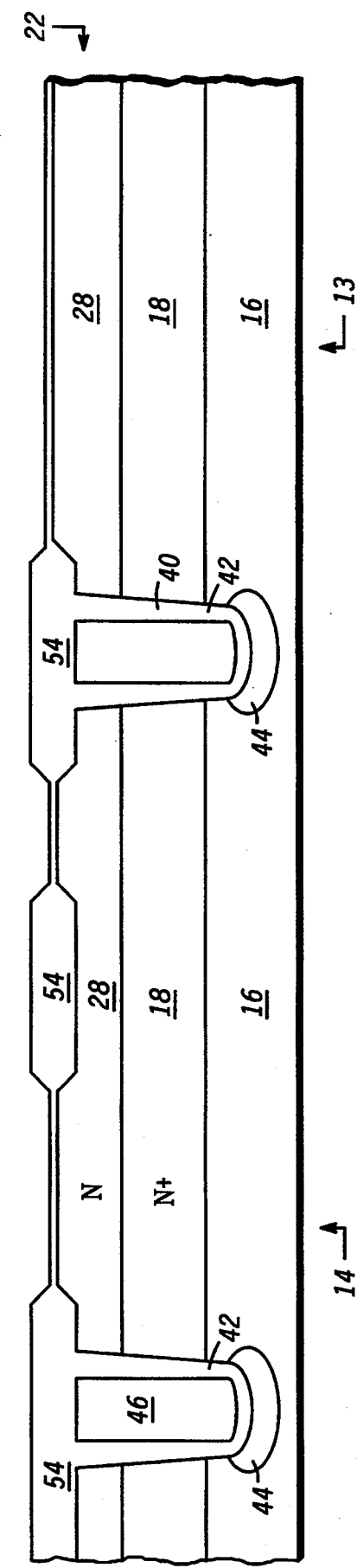

Following the formation of the field oxide regions 54, the nitride portions 48 and the nitride spacers 50 are removed. Once the nitride portions 48 and the nitride spacers 50 have been removed, the isolation module of structure 10 as depicted by FIGS. 9 and 10 is complete. Although a specific isolation module 10 is depicted herein, it should be understood that the present invention may be employed with many different isolation modules.

Once the isolation module depicted by FIGS. 9 and 10 has been fabricated, the actual fabrication of the varactor, bipolar, and MOS devices begins. FIGS. 11–22 are highly enlarged cross-sectional views of the varactor-BICMOS semiconductor structure 10 during device processing in accordance with the present invention. FIGS. 11, 13, 15, 17, and 19 represent the MOS region 12 of structure 10 and FIGS. 12, 14, 16, 18, and 20 represent the varactor and bipolar regions 13 and 14, respectively.

Now referring specifically to FIGS. 11 and 12, cathode regions 55 and a collector region 56 are formed in the varactor region 13 and in the bipolar region 14, respectively. Regions 55 and 56 are formed by implanting a dopant into the N well 28 of the varactor region 13 and the bipolar region 14. The cathode regions 55 and the collector region 56 are of an N+ conductivity type and have a dopant concentration in the range of $10^{18}$ to $10^{19}$ atoms/cm$^3$. Very high dopant concentrations are preferred for the regions 55 and 56. Those skilled in the art are aware that defect problems caused by the implant should be minimized. Although separate implanted cathode and collector regions 55 and 56, respectively, are shown and described herein, it should be understood that the N well 28 of the varactor region 13 and the N well 28 of the bipolar region 14 may be formed simultaneously or sequentially. Further, the regions 55 and 56 may extend through the N wells 28 to the N+ buried layer 18.

A gate oxide layer 58 is formed over the entire surface of the semiconductor structure 10. By way of example, the gate oxide layer 58 has a thickness on the order of 100 angstroms and is thermally grown, although it could be deposited by methods well known in the art. A gate protection polysilicon layer 60 (shown as a portion of polysilicon layer 62) is formed on the gate oxide layer 58. The polysilicon layer 60 has a thickness of approximately 500 angstroms and serves to protect the gate oxide layer 58 during future processing.

Threshold and punch-through implants are performed into the N well 28 and the P well 30 of the MOS region 12. An N-type dopant such as phosphorus is implanted into the P well 30 while a P type dopant such as boron is implanted into the N well 28. Either single or multiple implants into each well 28 and 30 of the MOS region 12 may be performed. These implants serve to control the threshold of the device and prevent punch-through.

Following the threshold and punch-through implants, the gate oxide layer 58 and the polysilicon layer 60 are selectively removed from the MOS region 12 and from the varactor region 13 using methods well known in the art. More particularly, the portions of the gate oxide layer 58 are removed from where the wells 28 and 30 are to be contacted by the first electrode polysilicon 62. The gate oxide layer 58 and the polysilicon layer 60 are completely removed from above the N wells 28 in the bipolar region 14.

A first electrode polysilicon layer 62 is formed conformally over the entire semiconductor structure 10. The first electrode polysilicon layer 62 is formed by methods well known in the art and has a thickness on the order of 2000 angstroms. The first electrode polysilicon layer 62 is undoped at deposition. Following the deposition of the first electrode polysilicon layer 62, a screen oxide layer 64 is formed over the entire surface of semiconductor structure 10. The screen oxide layer 64 is thermally grown and has a thickness on the order of 100 angstroms.

An active base 66 is formed in the N well 28 of bipolar region 14. A P type dopant such as boron or boron difluoride is implanted into a portion of the first electrode polysilicon layer 62. The semiconductor structure 10 is then annealed so that the dopant is driven from the portion of the first electrode polysilicon layer 62 into the N well 28 of the bipolar region 14 to form the active base 66. The active base 66 is, of course, P type and has a peak dopant concentration on the order of $10^{19}$ atoms/cm$^3$. Following the formation of the active base 66, a nitride layer 68, and a polysilicon layer 70 are formed over the surface of the semiconductor structure 10. As shown in FIGS. 11 and 12, both the nitride layer 68 and the polysilicon layer 70 are formed conformally. It should also be understood that additional layers may be formed on the polysilicon layer 70 for desired purposes.

Now referring specifically to FIGS. 13 and 14, the screen oxide layer 64, the nitride layer 68 and the polysilicon layer 70 are patterned and etched so that they are disposed only above the N wells 28 of the bipolar region 14 away from the collector region 56. An opening 72 is formed through the remaining portions of the screen oxide layer 64, the nitride layer 68 and the polysilicon layer 70. The opening 72 will later serve to define an emitter region. The remaining portions of the screen oxide layer 64, the nitride layer 68, and the polysilicon layer 70 will serve to later define the base electrode of the bipolar device.

Nitride spacers 74 are formed at the ends of the remaining portions of the screen oxide layer 64, the nitride layer 68, the polysilicon layer 70, and in the openings 72. The nitride spacers 74 are formed by depositing a conformal nitride layer (not shown) over the semiconductor structure 10 and then reactive ion etching the conformal nitride layer to form the spacers 74. The distance between the spacers 74 in the opening 72 may be less than is readily obtainable using well known lithographic methods. Preferably, this distance is on the order of 0.4 micrometers. A lens oxide layer 76 is formed on all exposed polysilicon of the MOS region 12, the varactor region 13, and the bipolar region 14 of semiconductor structure 10. This includes formation on the exposed portions of the first electrode polysilicon layer 62 and also on the exposed portions of the polysilicon layer 70. A portion of the lens oxide layer 76 is disposed in the opening 72 between the spacers 74. The lens oxide layer 76 is thermally grown and is on the order of 600 angstroms thick.

Now referring specifically to FIGS. 15 and 16, the nitride spacers 74 are removed leaving the portions of the first electrode polysilicon layer 62 disposed thereneath exposed. These exposed portions of the first electrode polysilicon layer 62 are then etched away to form slots 78 where the nitride spacers 74 were formerly disposed. The slots 78 not disposed inside the openings 72 extend to the field oxide regions 54 while the slots 78 disposed within the window 72 may extend into the silicon of the active base region 66. Following the formation of the slots 78, a screen oxide layer (not shown)

is formed on the surface of the MOS region 12, the varactor region 13, and the bipolar region 14.

Link base regions 80 are formed beneath the slots 78 in the window 72 following the formation of the screen oxide layer. The link base regions 80 are formed by implanting a P type dopant such as boron or boron difluoride through the slots 78 disposed in the opening 72. The link base regions 80 serve to link the active base region 66 to the extrinsic base contacts 82. The link base regions 80 have a dopant concentration on the order of $10^{18}$ atoms/cm$^3$. Although the link base regions 80 are implanted herein, it should be understood that they may be formed by other methods well known in the art.

Following the formation of the link base regions 80, the oxide spacers 84 are formed in the slots 78. The oxide spacers 84 are fabricated by forming an oxide layer (not shown) on the screen oxide layer, and etching the entire oxide layer, the screen oxide layer, and the lens oxide layer 76. The oxide spacers 84 are not etched. It should be understood that a densification anneal to densify the oxide layer may be performed prior to etching the oxide spacers 84 from the oxide layer, the screen oxide layer, and the lens oxide layer 76.

Figure 17:
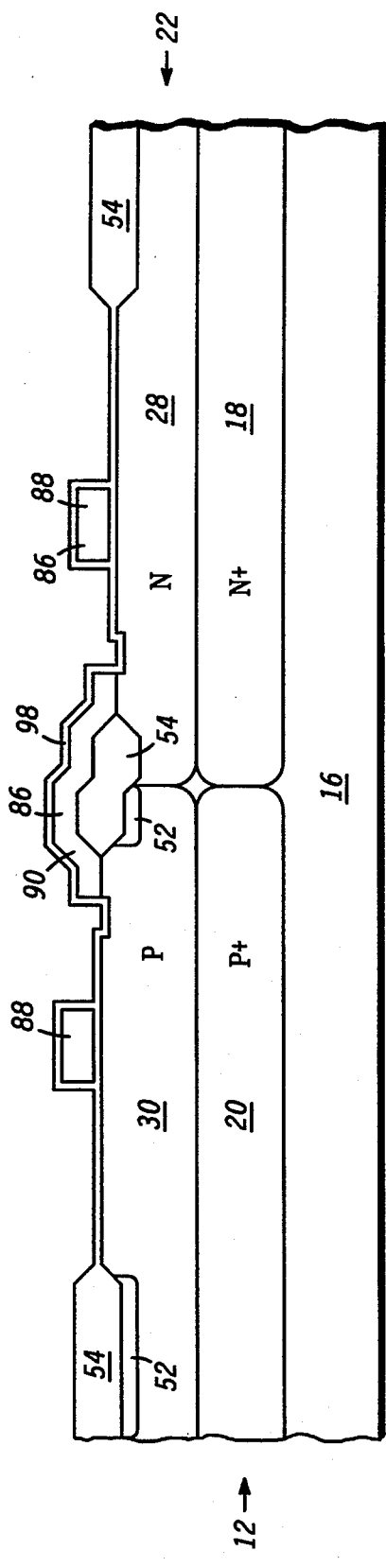
Figure 18:
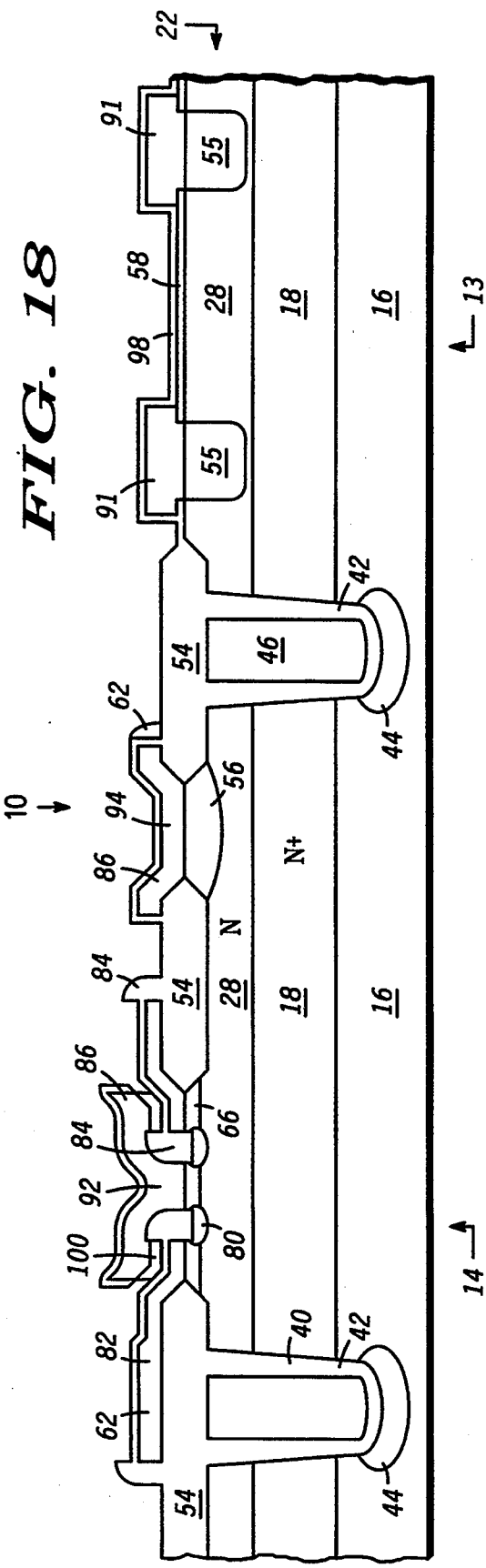

Now referring specifically to FIGS. 17 and 18, a second electrode polysilicon layer 86 is formed conformally over the MOS region 12, the varactor region 13, and the bipolar region 14. The second electrode polysilicon layer 86 is formed directly on the first electrode polysilicon layer 62 except where the portions of the screen oxide layer 64, the nitride layer 68 and the polysilicon layer 70 remain at the time of the deposition of the second electrode polysilicon layer 86. The second electrode polysilicon layer 86 is preferably undoped when deposited and has a thickness on the order of 1200 angstroms.

Following the deposition of the second electrode polysilicon layer 86, the second electrode polysilicon layer 86 and the first electrode polysilicon layer 62 are patterned and etched. Gate electrodes 88 and a buried contact electrode 90 are formed in the MOS region 12. Cathode electrodes 91 are formed in the varactor region 13. An emitter electrode 92 and a collector electrode 94 are formed on the bipolar region 14. Gate electrodes 88, the buried contact electrode 90, the cathode electrodes 91, the emitter electrode 92, and collector electrode 94 are each comprised of portions of the first electrode polysilicon layer 62 and the second electrode polysilicon layer 86. Additionally, the etching of the first and second electrode polysilicon layers 62 and 86, respectively, simultaneously removes the remaining portions of the polysilicon layer 70 and exposes the remaining portions of the nitride layer 68.

Following the patterning and etching of the first and second electrode polysilicon layers 62 and 86, respectively, a protective oxide layer 98 is formed on the exposed silicon portions of the MOS region 12, the varactor region 13, and the bipolar region 14. Although the protective oxide layer 98 is thermally grown herein, it should be understood that it may be deposited. The protective oxide layer 98 has a thickness on the order of 100 angstroms.

The cathode electrodes 91, the emitter electrode 92, and the collector electrode 94 are doped. Doping of the electrodes 91, 92, and 94 may occur either before or after the formation of the protective oxide layer 98. Arsenic or a similar N type dopant is implanted into the electrodes 91, 92, and 94 to obtain a dopant concentration on the order of $10^{20}$ atoms/cm$^3$. Following the implantation of the electrodes 91, 92, and 94, the remaining exposed potions of the nitride layer 68 are removed leaving only nitride portions 100 disposed beneath the lateral extensions of the emitter electrode 92, and the abutting oxide spacers 84.

Now referring specifically to FIGS. 19 and 20, lightly doped drain regions 102 are formed by implanting a dopant into the N well 28 and the P well 30 of the MOS region 12. Simultaneously, a lightly doped region 103 is formed by implanting the dopant into the N well of the varactor region 13 between the cathode regions 55. The lightly doped drain regions 102 are formed in P well 30 by implanting an N type dopant such as phosphorus. The lightly doped drain regions 102 are formed in the N well 28 of the MOS region 12 by implanting a P type dopant such as boron. The implants are self aligned to the gate electrodes 88. The lightly doped region 103 is also self-aligned to the gate electrode 91 by implanting an N type dopant into the N well of the varactor region 13. The lightly doped regions 102 and 103 have a surface dopant concentration on the order of $10^{18}$ atoms/cm$^3$.

Simultaneous with the formation of the lightly doped regions 102 and 103, the gate electrodes 88 and the buried contact electrode 90 are also doped. The gate electrode 88 and the portion of the buried contact electrode 90 disposed over the P well 30 are doped with an N type dopant while the gate electrode 88 and the portion of the buried contact electrode 90 disposed over the N well 28 are doped with a P type dopant.

Nitride spacers 104 are formed in the MOS region 12, the varactor region 13, and the bipolar region 14. In the MOS region 12, the nitride spacers 104 abut the sides of each gate electrode 88 and also the sides of the buried contact electrode 90. In the varactor region 13 the nitride spacers 104 abut the cathode electrodes 91. In the bipolar region 14, the nitride spacers 104 abut the sides of collector electrode 94 and those oxide spacers 84 not disposed in the opening 72. The nitride spacers 104 also abut the sides of the emitter electrode 92. The nitride spacers 104 which abut the emitter electrode 92 are coupled to the nitride portions 100. The nitride spacers 104 are formed by forming a conformal nitride layer (not shown) over the surface of the MOS region 12, the varactor region 13, and the bipolar region 14. Then, the unwanted portions of the conformal nitride layer are etched away to form the nitride spacers 104. Although spacers 104 comprise nitride herein, it should be understood that other dielectric materials may be substituted.

Figure 21:
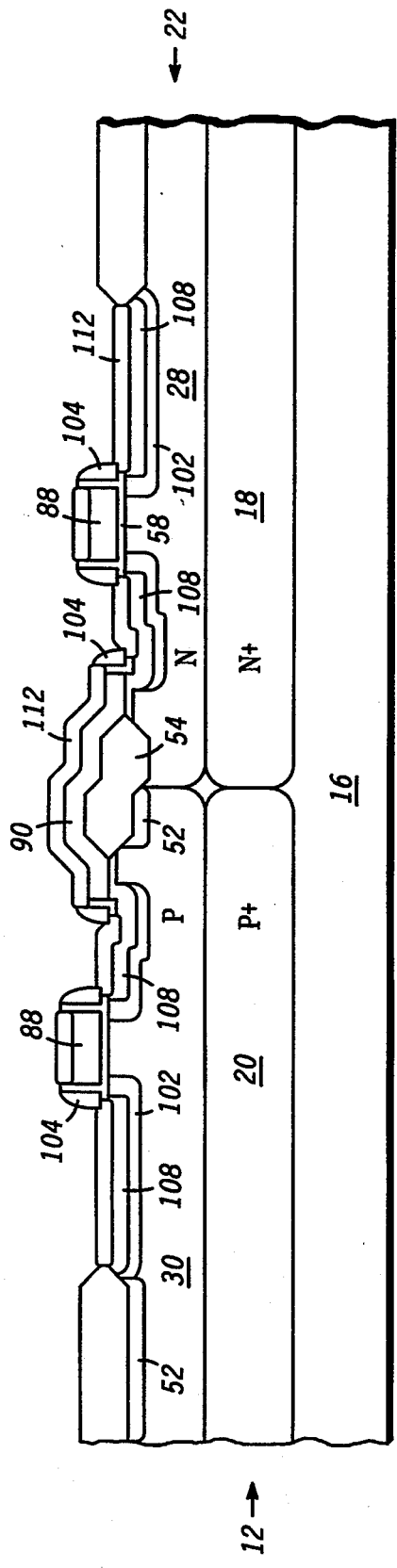
FIGS. 21 and 22 are highly enlarged cross-sectional views of the varactor-BICMOS semiconductor structure in accordance with an embodiment of the present invention.
Figure 22:
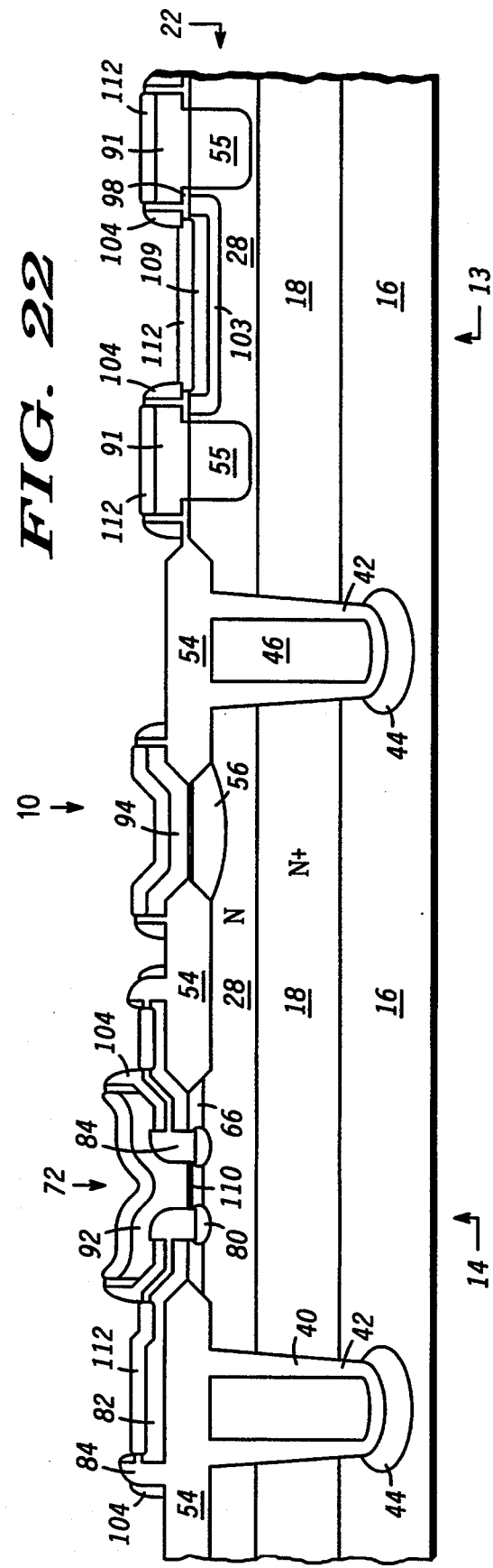

FIGS. 21 and 22 are highly enlarged cross-sectional views of the semiconductor structure 10 in accordance with the present invention. FIG. 21 represents the MOS region 12 of semiconductor structure 10 and FIG. 22 represents the varactor and bipolar regions 13 and 14, respectively. The source and drain regions 108 are implanted into the N well 28 and the P well 30 of the MOS region 12. The source and drain regions 108 are formed in the N well 28 by implanting a P type dopant such as boron while source and drain regions are formed in the P well 30 by implanting an N type dopant such as arsenic.

Simultaneously with the formation of the source and drain regions 108, the lightly doped region 103 is implanted with an impurity material of P conductivity type to form the anode region 109. Preferably, the source and drain regions 108 and the anode region 109 have a surface dopant concentration of at least $10^{20}$ atoms/cm$^3$. During the formation of the anode region 109, additional P type dopant (boron) may be implanted into the extrinsic base electrode 82. This implantation enhances the performance of the extrinsic base. The gate electrodes 88 and the buried contact electrode 90 are further doped during the formation of the source and drain regions 108.

Following the formation of source and drain regions 108, and the anode region 109, the semiconductor structure 10 is annealed. Preferably a rapid thermal anneal is employed. During the anneal, source and drain regions 108, and the anode region 109 are properly diffused. Further, the emitter region 110 is diffused from the emitter electrode 92 between the link base regions 80. Also during this anneal, additional dopant is diffused from the extrinsic base electrode 82 into the active base 66. Following the anneal, the protective oxide layer 98 is removed from the surface of the MOS region 12 and the bipolar region 14 of the semiconductor structure 10.

Once the oxide layer 98 is removed, a silicide 112 is formed on the exposed electrodes of the semiconductor structure 10. Although virtually any silicide may be formed, titanium disilicide is employed herein. The titanium disilicide 112 is formed by depositing a titanium layer on the MOS region 12, the varactor region 13, and the bipolar region 14. The semiconductor structure 10 is then annealed so that the deposited titanium reacts with the exposed silicon to form titanium disilicide. Following the anneal, non-silicided portions of the deposited titanium are etched away and the semiconductor structure 10 is annealed for a second time. As shown, the titanium disilicide 112 is formed on the gate electrodes 88, the buried contact electrode 90, and the source and drain regions 108 of the MOS region 12. The titanium disilicide is also formed in the cathode and anode regions 91 and 109, respectively, of the varactor region 13. Additionally, the titanium disilicide 112 is formed on the extrinsic base electrode 82, the emitter electrode 92, and the collector electrode 94 of the bipolar region 14.

Following the formation of the silicide 112, an interlayer dielectric such as oxide may be formed on the surface of semiconductor structure 10 and a multilayer metallization pattern may be formed thereon.

The method of fabricating a semiconductor structure having varactor, MOS, and bipolar devices shown herein employs split polysilicon electrodes wherein the gate electrodes 88, the buried electrode 90, the emitter electrode 92, the collector electrode 94, and the cathode electrode 91 are formed from at least two separately deposited layers of polysilicon. This allows for an extremely high performance varactor-BICMOS technology wherein a high performance varactor device is combined with a bipolar device and an advanced CMOS device.

Figure 23:
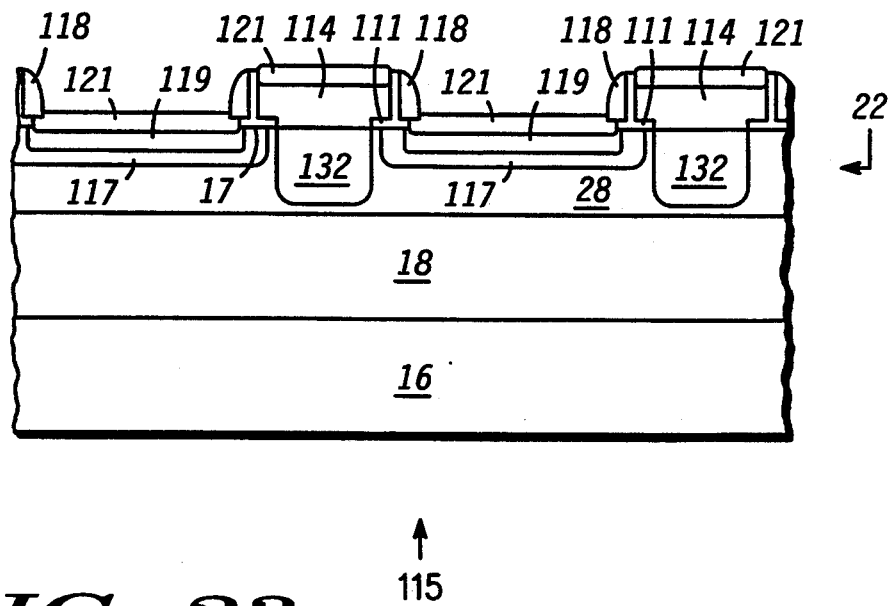
FIG. 23 is a highly enlarged cross-sectional view of a varactor in accordance with a second embodiment of the present invention.

A varactor-only flow may be easily derived from the varactor-BICMOS flow described herein. FIG. 23 is a cross-sectional view of a varactor 115 formed in accordance with an embodiment of the present invention. In the varactor 115 illustrated in FIG. 23 an N+ buried layer 18 is formed in the substrate 16 and a semiconductor material such as an epitaxial layer 22 having a major surface 17 is formed on the substrate 16 as described with reference to FIGS. 1 and 2. A screen oxide 111 is formed over the epitaxial layer 22. The screen oxide layer 111 has a thickness on the order of 100 angstroms and is thermally grown. It shall be understood that the method of forming the screen oxide layer 111 is not a limitation of the present invention and that it can be deposited by methods well known in the art. It shall be further understood that the screen oxide layer 111 is analogous to the gate oxide layer 58 described supra. Further, phosphorus or another N type dopant is implanted into the epitaxial layer 22 to form the N well 28, as described with reference to FIGS. 1 and 2.

Doped or cathode regions 132 are formed by implanting a dopant into the N well 28. The cathode regions 132 are of an N+ conductivity type and have a dopant concentration in the range of approximately $10^{18}$ to approximately $10^{19}$ atoms/cm$^3$. Although not shown, the cathode regions 132 may extend through the epitaxial layer 22 into the N+ buried layer 18. Preferably, the cathode regions 132 extend from the major surface 17 into the epitaxial layer 22 a first distance. Optionally, and subsequent to formation of the cathode regions 132, an anneal is performed.

Following the anneal of the cathode regions 132, the portions of the screen oxide layer 111 above the cathode regions 132 are removed using techniques well known to those skilled in the art. Similar to the deposition of the first electrode polysilicon layer 62 described with reference to FIGS. 11 and 12, an undoped electrode polysilicon layer (not shown) is formed conformally over the varactor 115. The electrode polysilicon layer is formed by methods well known in the art and has a thickness on the order of 3000 angstroms.

In a step analogous to the formation of the cathode electrodes 91 of FIGS. 17 and 18, the electrode polysilicon layer is patterned and etched to form cathode electrodes or conductors 114. The cathode electrodes 114 are also referred to as cathode conductors. A protective oxide layer (not shown) is formed on the exposed silicon portions of the varactor 115. By way of example, the protective oxide layer is thermally grown and has a thickness on the order of 100 angstroms.

In the next step, the cathode electrodes 114 are doped. Arsenic or a similar N type dopant is implanted into the cathode electrodes 114 to obtain a dopant concentration on the order of $10^{20}$ atoms/cm$^3$. The doping of the cathode electrodes 114 may occur either before or after the formation of the protective oxide layer.

Lightly doped regions 117 are self-aligned to the gate region 114 by implanting an N type dopant such as, for example, phosphorus into the N well 28. Preferably, the lightly doped regions 117 extend from the major surface 17 into the epitaxial layer 22 a second distance. Similar to the lightly doped regions 102 and 103 described in reference to FIGS. 19 and 20, the lightly doped regions 117 have a surface dopant concentration on the order of $10^{18}$ atoms/cm$^3$. It shall be understood that the term lightly doped is defined relative to the dopant concentrations of the source and drain regions 108. In other words, the regions that are specified as being lightly doped are lightly doped relative to the source and drain regions 108.

Nitride spacers 118 are formed on the varactor 115 by forming a conformal nitride layer (not shown) over the surface of the varactor 115. Then, the unwanted portions of the conformal nitride layer are etched away to form the nitride spacers 118. Analogous to the nitride spacers 104 of FIGS. 19 and 20, the spacers 118 are not limited to being nitride, but may be any suitable dielectric material.

The anode electrodes 119 are formed by implanting the lightly doped regions 117 with an impurity material of P conductivity type. The implant is self-aligned to the spacer region 118. The anode electrodes 119 are also referred to as anode conductors. Preferably the impurity material of P conductivity type which forms the anode electrodes 119 extends from the major surface 17 into the epitaxial layer 22 a third distance. The anode electrodes 119 are self-aligned to the spacer 118. In one embodiment, the cathode regions 132 extend further into the epitaxial layer than the lightly doped regions 117, and the lightly doped regions 117 extend a greater distance into the epitaxial layer 22 than the anode electrodes 119. In other words, the first distance is greater than the second distance, and the second distance is greater than the third distance. Subsequently, the anode electrodes 119 are annealed. Following the anneal, the protective oxide layer is removed and a silicide 121 is formed on the exposed electrodes of the varactor 115 to form conductors to the exposed electrodes.

Although the lightly doped regions 117 are shown as being interdigitated with the cathode regions 132, it shall be understood that this is not a limitation of the present invention. In other words, there may be a single cathode region 132 between and spaced apart from two lightly doped regions 117, a lightly doped region 117 in an annular shape surrounding the cathode region 132, etc.

Figure 24:
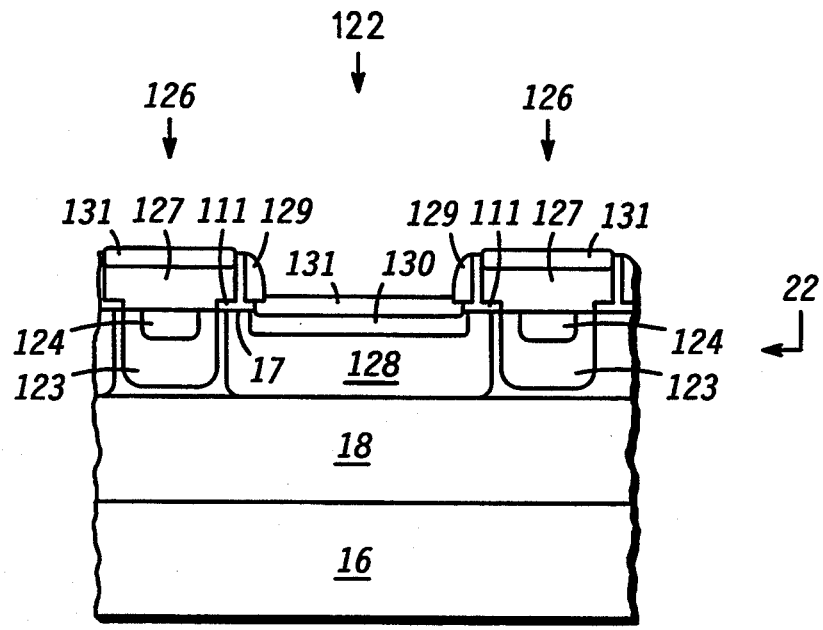
FIG. 24 is a highly enlarged cross-sectional view of a varactor in accordance with a third embodiment of the present invention.

FIG. 24 illustrates yet another embodiment of a varactor 122 formed in accordance with the present invention. In accordance with the description of FIG. 23, the epitaxial layer 22 is formed on the substrate 16, wherein the substrate 16 includes an N+ buried layer 18. A screen oxide 111 is formed over the epitaxial layer 22. As described supra, the screen oxide layer 111 has a thickness on the order of 100 angstroms, is thermally grown, and is analogous to the gate oxide layer 58. Phosphorus or another N type dopant is implanted into the epitaxial layer 22 to form the N well 28 as described with reference to FIGS. 1 and 2.

A cathode region 128 is formed by implanting a dopant into the N well 28. The cathode region is of an N+ conductivity type and has a dopant concentration in the range of approximately $10^{18}$ to approximately $10^{20}$ atoms/cm$^3$. It shall be understood that the cathode region 128 may extend through the epitaxial layer 22 into the N+ buried layer 18. Preferably, the cathode region 128 extends from the major surface 17 into the epitaxial layer 22 a first distance. Then, the cathode region 128 is annealed.

Following the anneal of the cathode region 128, a portion of the screen oxide layer 111 is removed, wherein the portion of the screen oxide layer 111 is over a portion of the surface 17 laterally spaced apart from the portion of the surface 17 above the cathode region 128. The portion of the screen oxide layer 111 is removed using techniques well known to those skilled in the art. An undoped electrode polysilicon layer (not shown) is formed conformally over the varactor 122. The electrode polysilicon layer is formed by methods well known in the art and has a thickness on the order of 3000 angstroms.

The undoped electrode polysilicon layer is patterned and etched to form the anode electrodes 127. The anode electrodes 127 are selectively implanted with an N type dopant and annealed to outdiffuse the impurity material and thereby form a doped region 123. The doped region 123 extends a second distance into the N well 28.

Nitride spacers 129 are formed on the varactor 122 by forming a conformal nitride layer (not shown) over the surface of the varactor 122. Then, the unwanted portions of the conformal nitride layer are etched away to form the nitride spacers 129. Analogous to the nitride spacers 104 of FIGS. 19 and 20, the spacers 129 are not limited to being nitride, but may be any suitable dielectric material.

The anode electrodes 127 are selectively implanted with a P type impurity material. The cathode region 128 is doped with an N type impurity material to form the cathode electrodes 130. The varactor 122 is thermally annealed to outdiffuse the impurity material and thereby form an outdiffused portion 124 of the anode electrode 127. The doped region 123 extends a second distance into the N well 28 and the outdiffused portion 124 extends a third distance into the N well 28.

A silicide 131 is formed on the exposed electrodes of the varactor 122.

Thus is it apparent that there has been provided, in accordance with the invention a method of fabricating a semiconductor structure having varactor, MOS, and bipolar devices. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention. For example, the first distance may be less than the second distance, or the first and second distances may be approximately equal.

We claim:

1. A method of fabricating a semiconductor structure having MOS, bipolar, and varactor devices, comprising the steps of:
    providing an isolation structure having MOS, bipolar, and varactor active areas, each active area including a doped well;
    forming a first dopant region in the bipolar active area and a second dopant region in the varactor active area;
    forming a first semiconductor layer over the MOS, bipolar, and varactor active areas;
    forming an active base region in the bipolar active area doped well;
    forming a dielectric layer on portions of the first semiconductor layer over the bipolar and the varactor active areas;
    forming an opening in the dielectric layer, the opening extending to the first semiconductor layer;
    forming a second semiconductor layer over the MOS, bipolar, and varactor active areas;
    forming a gate electrode in the MOS active area, emitter and collector electrodes on the bipolar active area, and a first varactor electrode on the varactor active area, wherein the gate, emitter, collector, and first varactor electrodes are formed from the first and second semiconductor layers, and the emitter electrode extends into the opening;
    doping the emitter, collector, and first varactor electrodes;
    forming self-aligned source and drain regions in the MOS active area, and a self-aligned varactor dopant region in the varactor active area;
    forming a second varactor electrode on the varactor active device area; and
    diffusing an emitter region into the bipolar active area doped well from the emitter electrode through the opening.

2. A method of fabricating a semiconductor structure having MOS, bipolar, and varactor devices as claimed in claim 1, further including the step of forming silicide on the gate, emitter, collector, and first electrodes, and in the source, drain, and the self-aligned varactor dopant region.

3. A method of fabricating a semiconductor structure having MOS, bipolar, and varactor devices as claimed in claim 1, wherein the second dopant region in the varactor active area extends into the varactor active area a first distance, and the self-aligned varactor dopant region in the varactor active area includes a third dopant region extending into the doped well of the varactor active area a second distance, and a fourth dopant region extending into the third dopant region a third distance.

4. A method of fabricating a semiconductor structure having MOS, bipolar, and varactor devices as claimed in claim 3, wherein the first distance is greater than the second distance, and the second distance is greater than the third distance.

5. A method of fabricating a semiconductor structure having MOS, bipolar, and varactor devices as claimed in claim 1, wherein the bipolar and varactor active areas include a buried layer, and the first dopant region in the bipolar active area and the second dopant region in the varactor active area extend to the buried layer.

* * * * *